United States Patent [19]

King et al.

[11] Patent Number: 4,737,646
[45] Date of Patent: Apr. 12, 1988

[54] METHOD OF USING AN ELECTRON BEAM

[75] Inventors: Hewson N. G. King, Redhill; James P. Beasley, Tadworth, both of United Kingdom

[73] Assignee: U.S. Philips Corporation, New York, N.Y.

[21] Appl. No.: 435,025

[22] Filed: Oct. 18, 1982

[30] Foreign Application Priority Data

Nov. 2, 1981 [GB] United Kingdom ............... 8132928

[51] Int. Cl.$^4$ .............................................. H01J 37/00
[52] U.S. Cl. ............................ 250/491.1; 250/492.22
[58] Field of Search ................ 350/492.22, 491.1, 398, 350/396 R; 219/121 EM, 121 ED

[56] References Cited

U.S. PATENT DOCUMENTS 4,145,597  3/1979  Yasuda et al. ................. 250/396 R
4,357,540  11/1982 Benjamin et al. ............... 250/491.1

OTHER PUBLICATIONS

"Computer-Controlled Scanning Electron Microscope System for High-Resolution Microelectronic Pattern Fabrication", Ozdemictron, *IEEE Trans. on Electron Devices*, vol. 19, No. 5, May 1972, pp. 624–628.

Primary Examiner—Bruce C. Anderson
Attorney, Agent, or Firm—Paul R. Miller

[57] ABSTRACT

When an electron beam is used to effect a process at two adjacent surface areas of a target, such as a semiconductor wafer coated with an electron sensitive resist, various alignment errors can occur, such as where the wafer becomes distorted. The provision of a reference marker, for example a square-etched depression, at the surface of the target between the areas of the target enables the detection of any such distortion. After carrying out the process at one of the areas, an electron beam with a rectangular-shaped spot is directed, in turn, toward the predetermined positions of two mutually transverse sides of the reference marker. In the absence of any alignment error, the beam spot overlies the side in question in order to overlap the marker and the area of the target in the immediate vicinity. Back-scattered electrons can then be detected to give a signal representative of any deviation between the actual position and the predetermined position of the marker so that the electron beam can be correctly aligned when effecting the process of the second of the two areas. For increased accuracy of alignment, a plurality of markers may be provided between the adjacent surface areas.

11 Claims, 1 Drawing Sheet

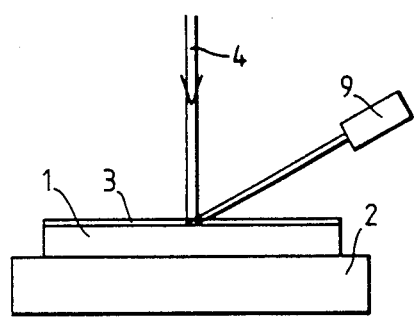
Fig.1.
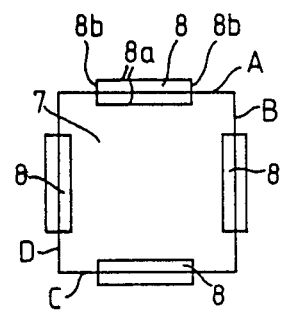
Fig.4.
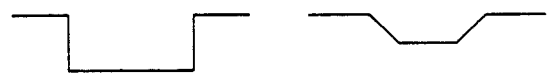
Fig.3a.   Fig.3b.   Fig.3c.
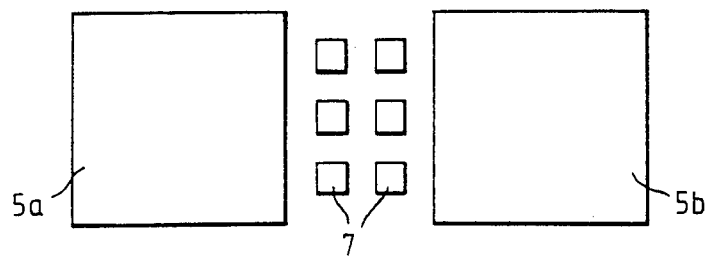
Fig.2.
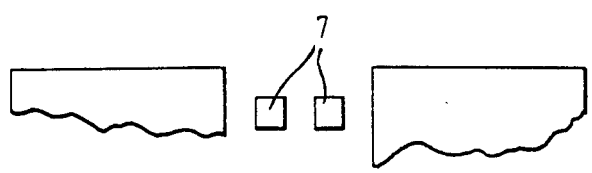

METHOD OF USING AN ELECTRON BEAM

This invention relates to a method of using an electron beam to effect sequentially a process at two adjacent surface areas of a target.

An important application of electron beam technology is in the manufacture of semiconductor devices. In particular, a so-called electron beam pattern generator can be used to direct an electron beam towards a target in the form of a semiconductor substrate coated with an electron sensitive resist. By computer control of the beam a predetermined pattern can be drawn in the resist. The exposed parts (or, in the case of a negative resist, the unexposed parts) of the resist are then removed selectively using an appropriate chemical. The remaining parts of the resist form on the surface of the semiconductor substrate a masking layer which can be used subsequently in the processing of the semiconductor wafer.

Unfortunately the area (sometimes called the deflection field) which can be scanned by the electron beam is somewhat restricted because of the occurrence of electron optical aberrations which increase markedly as the electron beam deviates more and more from the optical axis. This presents a problem when large areas of resist are to be exposed. However, in the manufacture of semiconductor devices such as integrated circuits, it is usually the case that the same, relatively small pattern has to be drawn repeatedly across a large semiconductor substrate. Because of this, the beam can be used to draw one pattern at a first area of the substrate before moving the substrate to introduce a new area of the substrate to the electron beam. Thus the same (or a different) pattern can be drawn at this new area without the need for the beam to have an unduly large deflection field. In fact, as long as the subtrate can be moved in two transverse directions the whole of a resist layer present on a semiconductor substrate having, for example, a diameter of 4 inches can be exposed by sequentially drawing the same pattern at relatively small areas, typically 3 mm square, across the surface of the substrate. Not surprisingly, this technique has come to be known as the step-and-repeat method.

A conventional pattern generator produces an electron beam with a spot which is circular and has a Gaussian intensity distribution. As the beam has a typical diameter of 0.2 micrometer it can fairly be described as a point beam.

If the pattern to be drawn at a particular area of a substrate can be divided into basic rectangular elements, as is usually the case, then the point beam is made to draw the outline of each rectangle and then to fill it in by scanning the rectangle before preceeding to the next rectangle. When the complete pattern has been drawn at that area the substrate is moved so that the same pattern can be drawn at the next area as described above.

Before the semiconductor substrate is exposed to the electron beam it is usual to perform an initial, relatively coarse alignment of the substrate. Nevertheless, it is still possible for alignment errors to be introduced during device manufacture as a result of instabilities in either the electron beam pattern generator or in the semiconductor substrate. For example, the semiconductor substrate can become distorted as a result of the various treatments to which it is subjected. To compensate for any such errors it is usual to employ a reference marker system on the substrate surface. Thus, the electron beam can be directed towards the predetermined position of a marker to derive a signal representative of the deviation between the actual position and the predetermined position of that marker. This signal can then be used either to correct the substrate movement or to add a correction factor to the electron optical system so that the next time the electron beam draws the pattern it does so at the correct location.

The reference marker may be a depression in the semiconductor substrate, for example a square of 20 micrometers × 20 micrometers. When the areas at which the pattern is to be drawn are square such a marker may be located at the four corners of each such area. Before drawing the pattern at any given area the beam is directed, in turn, towards the four reference markers at the corners of that area. The beam is scanned, for example 8 times across each edge of the marker, the scan direction being transverse to the edge in question. By observing the back-scattered electrons the deviation between the actual position and the predetermined position of the marker can be determined. To minimize errors, similar information is gathered from each of the four markers at the corners of a particular area before the pattern is drawn at that area.

More recently there have been developments in the technology of pattern generators which allow the spot size of the electron beam to be varied. For example the paper entitled "Variable spot-shaped electron beam lithographic tool" by E. V. Weber and R. D. Moore in the Journal of Vacuum Science Technology, 16(6), November/December 1979 describes a beam with a rectangular-shaped spot which can be varied in size up to 4 micrometers × 4 micrometers. Other systems which have been described have an even greater range over which the spot size can be varied. Clearly, the variable spot-shaped electron beam system is ideally suited to drawing patterns in a resist coating on a semiconductor substrate, particularly when the pattern can be decomposed into basic rectangular elements. In this case the time taken to draw a pattern at a given area can be decreased considerably. This has the important consequence that pattern generators producing variable spot-shaped electron beams can have an increased throughput as compared with their point beam counterparts.

Of course, the problem of alignment errors is still present so that the need for a compensating system has not been removed. In their paper (mentioned above) Weber and Moore describe an alignment system which involves the scanning of reference markers present at the four corners of each area of the substrate where a pattern is to be drawn. The resulting back-scattered electron signals can then be processed to determine position errors at the four corners of each area.

Although the scanning of reference markers, as previously described in relation to the point pattern generator, is effective in determining position errors of markers it is a relatively slow technique which, when used in conjunction with the variable spot-shaped electron beam pattern generator, inevitably erodes the advantage resulting from the reduced exposure time.

According to the present invention there is provided a method of using an electron beam to effect sequentially a process at two adjacent surface areas of a target, a reference marker being provided between the areas, which method, after effecting the process at one of the areas includes the steps of directing an electron beam with a rectangular-shaped spot toward the predetermined position of a first side of the reference marker such that two sides of the beam spot are substantially parallel to the first side and such that, in the absence of an alignment error, the beam spot overlies the first side and overlaps the reference marker and the area of the target immediately adjoining the first side, directing an electron beam again with a rectangular-shaped spot toward the predetermined position of a second side of the reference marker such that two sides of the beam spot are substantially parallel to the second side such that, in the absence of an alignment error, the beam spot overlies the second side and overlaps the marker and the area of the target immediately adjoining the second side, the second side of the reference marker being transverse to the first side, detecting the resulting back-scattered electrons using a detector to provide signals representative of any deviation between the actual position and the predetermined position of the first and second sides of the reference marker, and responding to the signals by compensating for any such deviation when effecting the process at the second of the areas.

By using an electron beam with a rectangular-shaped spot not only is the need to scan the sides of the reference marker avoided, but also the beam current can be considerably higher than that of a point beam. This has the advantage that the number of back-scattered electrons can be significantly higher so that the detection of position errors can be carried out more quickly.

Because the reference marker has two mutually transverse sides and because the beam is directed toward each of these sides in turn the two signals derived from the detector are representative of position errors occurring in the two directions orthogonal to the sides of the reference marker. Thus any position error which can be resolved into position errors in these two directions can be detected using a method in accordance with the invention.

The reference marker may have a different topology to the surrounding area of the target and/or it may be constituted by an area of material having a different back-scattering coefficient to the material of the target. For example, when the target is a silicon substrate coated with an electron-sensitive resist the reference marker may be an island of silicon oxide or of a metal such as tantalum formed directly on the substrate surface. Alternatively, the reference marker may be a depression at the surface of the target formed, for example, by etching with an appropriate chemical. The reference marker may have any geometric shape provided that it has at least two mutually transverse sides. However, directing the beam toward the sides of the reference marker is particularly straightforward when the reference marker is square. In this case the electron beam can be directed toward the predetermined position of each side of the reference marker in turn. For increased accuracy the back-scattered electrons can then be detected at each position of the beam so that an average value for the deviation between the predetermined position and the actual position of the reference marker can then be determined.

For even greater accuracy a plurality of similar reference markers can be provided between the two surface areas of the target. In this case the beam can be directed toward the predetermined position of each side of each reference marker in turn. The back-scattered electrons can then be detected at each position of the beam allowing an average value for any alignment error to be determined. The provision of a plurality of similar reference markers is particularly advantageous not only because the effects due to the presence of a poorly-defined reference marker can then be minimized, but also because the signal-to-noise ratio of the detected signal can be increased allowing high accuracy and greater speed.

An embodiment of the invention will now be described, by way of example, with reference to the accompanying drawing, in which FIG. 1 is a diagrammatic cross-sectional view of a semiconductor wafer which is subjected to a method of using an electron beam in accordance with the invention, FIG. 2 is a plan view of part of the semiconductor wafer of FIG. 1, FIGS. 3a to 3c, are cross-sectional views of different forms of reference marker which can be provided in the semiconductor wafer, and FIG. 4 is a plan view of one such reference marker.

It should be noted that, for the sake of clarity, the FIGS. are not drawn to scale.

In FIG. 1 a semiconductor wafer 1 is located on a movable table 2 of a variable spot-shaped electron beam pattern generator. The wafer 1 is coated on the major surface directed away from table 2 with a layer 3 of electron sensitive resist. The wafer 1, which is generally circular, may have a diameter of approximately 4 inches and it is divided into areas 3 millimeters square where a process is to be effected sequentially using the electron beam 4. For example, at each such area an integrated circuit may be formed in conventional manner. For the sake of clarity these areas are not shown in FIG. 1. However, FIG. 2 shows two such areas 5a, 5b on a greatly distorted scale. The spacing between adjacent areas 5 may be for example 100 micrometers. None of the circuit elements of the integrated circuits is formed in the space between adjacent areas, because this represents the so-called scribe lane where the semiconductor wafer 1 will later be severed to divide it into individual integrated circuits.

In the vertical direction, between adjacent areas 5a and 5b, there are six similar reference markers 7 in the form of depressions at the surface of the wafer 1. The markers may, in fact, be squares of 20 micrometers×20 micrometers spaced apart by 20 micrometers.

These reference markers 7 may be formed by chemically etching the silicon wafer in known manner. Depending on the way in which the etching is performed the depressions may have vertical sides as shown in FIG. 3a, sloping sides and a horizontal bottom as shown in FIG. 3b, or four sloping sides which meet at a point, as shown in FIG. 3c. Typically these depressions may be in the range of 1 to 15 micrometers deep.

In the electron beam pattern generator the variable spot-shaped beam is used to selectively expose one of the areas 5a of the wafer 1 which is coated with resist. This process is carried out to define in the resist a pattern so that selective removal of the unexposed (or, as the case may be, the exposed) parts of the resist 3 leave a masking layer for use in subsequent processing of the semiconductor wafer in the manufacture of integrated circuits. After having exposed one such area 5a the table 2 is moved to introduce an adjacent area 5b into the deflection field of the electron beam. The table is adapted to move in directions parallel and orthogonal to the scribe lanes in which the reference markers 7 are provided.

In between effecting the process at the areas 5a and 5b, that is to say after exposing area 5a and before exposing area 5b it is arranged that the electron beam has a rectangular-shaped spot. This electron beam is directed toward each side of each marker in turn. FIG. 4 shows in more detail the electron beam with a rectangular-shaped spot 8 incident on a single marker 7. The beam spot 8 is directed toward the predetermined position of a first side A of the marker 7 such that the two sides 8a of the beam spot are substantially parallel to the side A of the marker. In the absence of any alignment error the beam spot 8 overlies side A of the marker 7 such that it overlaps the reference marker and the area of the target immediately adjoining the side A.

The sides 8a of the beam spot 8, which are parallel to side A of the marker 7 are longer than the sides 8b of the beam spot. The ratio of long-to-short sides for the beam spot reflects a compromise based on the following conflict, viz. the sensitivity of error detection increases as this ratio increases, whereas the ease with which the beam can be aligned with the sides of the reference marker increases as this ratio decreases. A satisfactory compromise may be reached when the ratio of long-to-short sides for the beam spot is, for example, 10:1. The longer side 8a may be shorter than side A of the marker 7 but preferably its length is between one-quarter and three-quarters the length of side A. Thus, for example, if the reference marker is a square of 20 micrometers the beam spot may be 10 micrometers long and 1 micrometer wide.

When the electron beam is directed toward side A of the reference marker the back-scattered electrons are detected using a detector 9. A comparison of the actual signal from the detector 9 with the expected signal indicates the extent of any deviation between the actual position and the predetermined position of side A.

By directing the electron beam towards the predetermined position of the opposite side C of the marker 7, two separate signals are obtained for indicating any alignment error in the direction at right angles to the sides A and C.

To determine the extent of an alignment error in the direction parallel to sides A and C the beam is then directed, in turn, toward the other two sides B and D of the reference marker 7. However, although the beam still has a rectangular-shaped spot of the same dimensions, it is arranged that its longer sides are parallel to side B. Detection of the back-scattered electrons is carried out as before.

The electron beam can then similarly be directed toward each side of the remaining reference markers 7 (see FIG. 2). Thus for the two directions parallel to the sides of the reference markers two signals representative of alignment errors can be derived for each reference marker. These signals can be used to obtain an average value for the alignment errors in these directions. Therefore, it is possible to compensate for any such deviation when effecting the electron beam exposure process at the next area 5b. Consequently, the next time the electron beam draws a pattern it does so at the correct location. This may be achieved by adding a correction factor to either the table movement or to the electron optical system.

By using this method account can be taken of any alignment errors such as distortions which occur in the wafer 1 during processing, and the appropriate correction can be made when exposing the electron-sensitive resist to the electron beam.

By using a variable spot-shaped beam position errors can be detected very quickly, so much so that the table can be moving between subsequent processing treatments while the alignment error detection is taking place simultaneously. Thus, the throughput of semiconductor wafers in the pattern generator can be significantly increased.

The embodiments described here are given merely by way of example. In the light of the above description it will be clear to the person skilled in the art that many modifications are possible within the scope of the invention.

What is claimed is:

1. In a method of using an electron beam to sequentially carry out a process at least at two adjacent surface areas of a target, wherein at least one reference marker is provided between said two areas, said method comprising the steps of carrying out said process at one of said two surface areas of said target, thereafter directing an electron beam having a rectangular shaped beam spot toward a predetermined position of a first side of said reference marker, said rectangular beam spot having two sides substantially parallel to said first side of said reference marker, wherein in the absence of an alignment error, said rectangular beam spot overlies said first side overlapping both said reference marker and an area of said target immediately adjoining said first side of said reference marker, directing an electron beam having another rectangular shaped beam spot toward a predetermined portion of a second side of said reference marker, said another rectangular beam spot having two sides substantially parallel to said second side of said reference marker, said second side of said reference marker being transverse to said first side of said reference marker, wherein in the absence of an alignment error, said another rectangular beam spot overlies said second side overlapping both said reference marker and an area of said target immediately adjoining said second side of said reference marker, detecting back-scattered electrons by a detector to provide signals representative of a deviation between the actual position and the predetermined position of said first and second sides of said reference marker, and compensating for said deviation by responding to said signals before carrying out said process at another of said adjacent surface areas.

2. A method according to claim 1, wherein said rectangular beam spot directed toward said first side of said reference marker has longer sides of said rectangular shape substantially parallel to said first side of said reference marker, and wherein said another rectangular beam spot directed toward said second side of said reference marker has longer sides of said rectangular shape substantially parallel to said second side of said reference marker.

3. A method according to claim 2, wherein said longer sides of said rectangular beam spot directed toward said first side of said reference marker have a length of between one-quarter and three-quarters the length of said first side of said reference marker, and wherein said longer sides of said another rectangular beam spot directed toward said second side of said reference marker have a length of between one-quarter and three-quarters the length of said second side of said reference marker.

4. A method according to claim 1, wherein said longer sides of said rectangular beam spot directed toward said first side of said reference marker have a length of between one-quarter and three-quarters the length of said first side of said reference marker, and wherein said longer sides of said another rectangular beam spot directed toward said second side of said reference marker have a length of between one-quarter and three-quarters the length of said second side of said reference marker.

5. A method according to claim 1, wherein said reference marker is square, and wherein said rectangular beam spot is directed toward said predetermined position at each side of said square reference marker respectively.

6. A method according to claim 5, wherein said signals are representative of deviations between said actual position and said predetermined position at each side of said reference marker.

7. A method according to claim 1, wherein said reference marker is provided as a depression at the surface of said target between said two adjacent surface areas.

8. A method according to claim 7, wherein said depression is formed by chemically etching said target surface.

9. A method according to claim 1, wherein a plurality of similar reference markers is provided between said two adjacent surface areas of said target, and wherein said rectangular beam spot is directed toward predetermined positions of each side of each reference marker in turn.

10. A method according to claim 1, wherein each rectangular beam spot has a length-to-width ratio of 10:1.

11. A method according to claim 1, wherein said first and another rectangular beam spots have the same dimensions.

* * * * *